United States Patent
Balamurugan et al.

(10) Patent No.: US 7,919,984 B2
(45) Date of Patent: Apr. 5, 2011

(54) SYSTEM AND APPARATUS OF RECONFIGURABLE TRANSCEIVER DESIGN FOR MULTI-MODE SIGNALING

(75) Inventors: Ganesh Balamurugan, Hillsboro, OR (US); Bryan Casper, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/347,858

(22) Filed: Dec. 31, 2008

(65) Prior Publication Data
US 2010/0164539 A1 Jul. 1, 2010

(51) Int. Cl.
*H03K 19/0175* (2006.01)
(52) U.S. Cl. .......................... 326/82; 326/68
(58) Field of Classification Search .......... 326/82–83, 326/86–87, 68; 327/108, 109, 333
See application file for complete search history.

(56) References Cited

U.S. PATENT DOCUMENTS

| | | | |
|---|---|---|---|
| 6,856,178 B1* | 2/2005 | Narayan | 327/108 |
| 6,924,668 B2* | 8/2005 | Muller et al. | 326/83 |
| 7,061,273 B2* | 6/2006 | Wang et al. | 326/86 |
| 7,164,292 B2* | 1/2007 | Schmitt et al. | 326/86 |

OTHER PUBLICATIONS

Stojanovic, V., et al., "Autonomous Dual-Mode (PAM2/4) Serial Link Transceiver with Adaptive Equalization and Data Recovery," Solid-State Circuits, IEEE Journal, vol. 40, No. 4, pp. 1012-1026, Apr. 2005.

* cited by examiner

*Primary Examiner* — James Cho
(74) *Attorney, Agent, or Firm* — Blakely, Sokoloff, Taylor & Zafman LLP

(57) ABSTRACT

A reconfigurable transceiver is claimed for a wide range of I/O systems. The reconfigurable transmitter of the reconfigurable transceiver is capable of transmitting multi-level signals in single-ended and differential modes by current and voltage mode signaling. The signal for transmission can be pre-emphasized for all transmitting modes. The reconfigurable transceiver can dynamically scale bandwidth and power consumption based on performance metrics.

17 Claims, 6 Drawing Sheets

US 7,919,984 B2

SYSTEM AND APPARATUS OF RECONFIGURABLE TRANSCEIVER DESIGN FOR MULTI-MODE SIGNALING

FIELD OF THE INVENTION

The present invention relates to a system and apparatus of a reconfigurable multi-mode transceiver that is capable to dynamically adapt its signaling mode based on system bandwidth, power consumption, and other performance requirements.

BACKGROUND

The input-output (I/O) links today span over a wide range of performance requirements. For example, depending on the application domain of a system, custom I/Os are designed to satisfy a predetermined, but narrow, range of power consumption, bandwidth, and speed performance parameters. Some of these custom I/Os are specifically designed as voltage mode I/Os, some designed as current mode I/Os, some have pre-emphasis to improve the signal integrity on transmission lines, and some of these I/Os are differential I/Os requiring twice as many pins to drive and receive data.

The choice of I/O topology is based on the specific use of the system. Some the I/Os listed above are designed for short chip-to-chip communications, while others are designed for transmitting data across long routes, for example, between servers in a server rack. Moreover, each custom I/O transceiver (transmitter and receiver) is designed for a particular signaling mode. For example, for low bandwidth requirements, a 2-pulse amplitude modulation (PAM) based I/O is designed while for higher bandwidth requirements a 4-PAM based I/O is designed.

However, it is not practically feasible for today's custom I/Os to dynamically change the system performance by dynamically scaling (up or down) the bandwidth of the custom I/O, or to dynamically control the power consumption of the custom I/O, or to switch between single ended voltage mode signaling to a current mode differential signaling in a custom I/O, while continue to optimize and control system performance parameters such as power consumption, bandwidth, signal integrity, voltage swing, and inter-symbol interference, across a wide range.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

The embodiments discussed in this section generally relate to a reconfigurable multi-mode transceiver (transmitter and receiver) in an electrical system. Referring to the figures, exemplary embodiments are described. The exemplary embodiments are provided to illustrate the embodiments and should not be construed as limiting the scope of the embodiments.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

A reconfigurable transceiver is described in detail in relation to its function of a reconfigurable transmitter and a reconfigurable receiver in a system.

Figure 1:
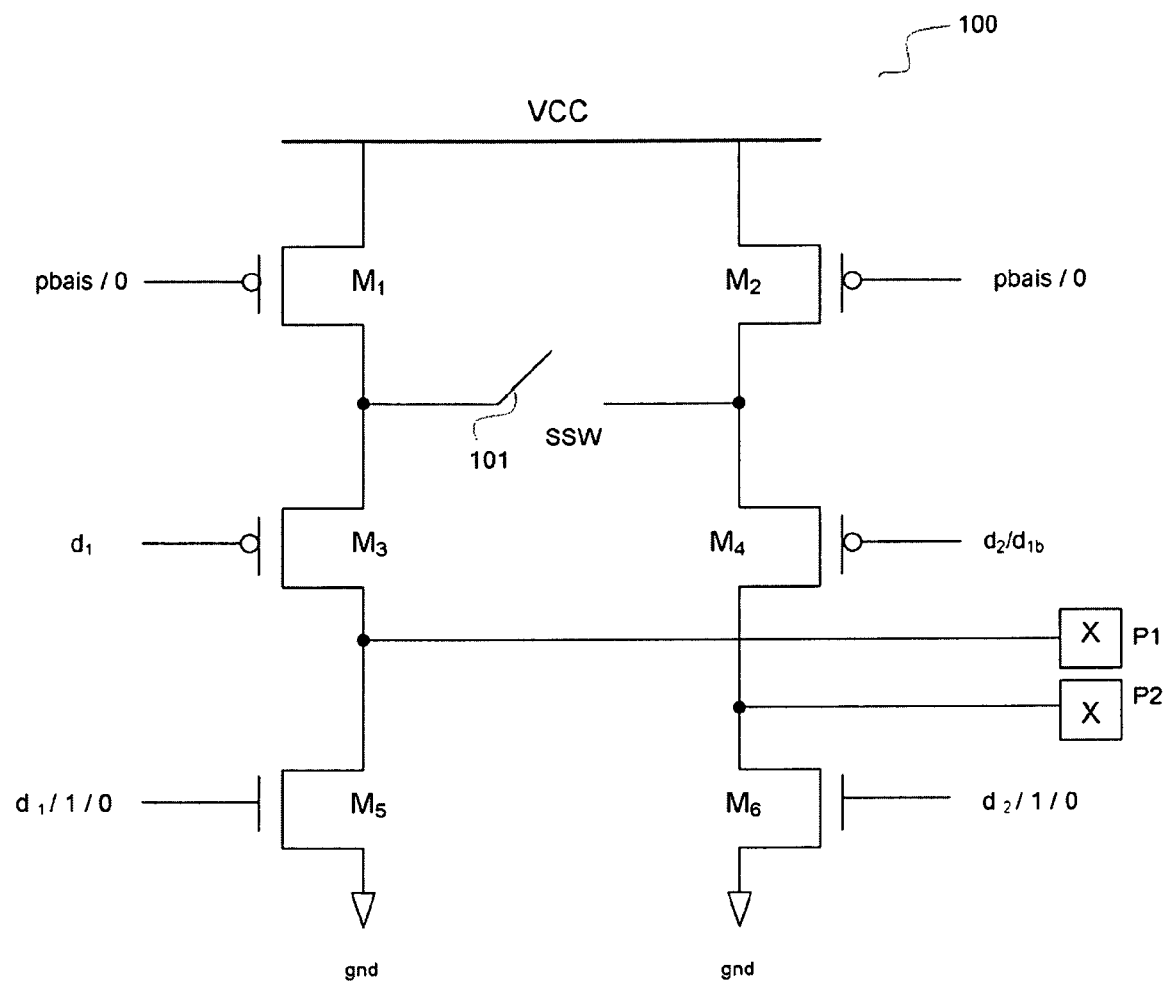
FIG. 1 is a transistor level topology of a reconfigurable transmitter according to one embodiment of the present invention.

FIG. 1 shows a transistor level topology of a reconfigurable transmitter that is capable of transmitting multi-mode signals including, 2-pulse amplitude modulation (PAM), 3-PAM, 4-PAM etc. Furthermore, the reconfigurable transmitter is also capable of transmitting signals in single-ended voltage mode, differential voltage mode, and differential current mode. The transistor topology in FIG. 1 is a CMOS transmitter with PMOS input transistors $M_3$ and $M_4$, according to one embodiment of the present invention. In one embodiment the PMOS input transistors $M_3$ and $M_4$ are replaced by NMOS input transistors in other embodiments. The inputs $d_1$ and $d_2$ (or $d_{1b}$ in some configurations) are driven by Pre-drivers that control timing parameters, such as; delay, swing, and slope of the input signals $d_1$ and $d_2$ (or $d_{1b}$ in some configurations). These timing parameters control the switching characteristics of the input transistors $M_3$ and $M_4$. For example, a faster slope of the input signal (for example, 10 ps/V) will turn on or off the input transistors faster than a slower slope (for example, 10 ns/V) on the input transistors.

In one embodiment, the number and size (W/L) of $M_3$ and $M_4$ input transistors varies depending on the performance requirement of the transmitter.

Transistors $M_5$ and $M_6$ provide termination impedance. Generally the termination impendence is 50-60 Ohms. However, some systems are designed for higher and lower termination impedances, for example, 150 Ohms and 20 Ohms respectively. The value of impedance is chosen based on the desired performance goal such as signal integrity (overshoot, undershoot, ring-back etc). In other embodiments, the impedance value or range is chosen based on other parameters. The reconfigurable transmitter is configured, in one embodiment, to receive input signals $d_1$ and $d_2$ to provide dynamic termination. In other embodiments, logic high and low values are fed as input to the impedance transistors $M_5$ and $M_6$. In one embodiment, the termination impedance transistors vary in number and size (W/L) based on the parameters such as, process technology, transistor reliability, desired impedance values and other performance parameters discussed previously. In one embodiment, the termination impedance transistors are thermometer weighted. In another embodiment, the termination impedance transistors are binary weighted. 'Thermometer" and "binary" weighting is well known in the art and so they are not discussed in further. These schemes are mentioned just for illustration purposes, other schemes can be used in the present invention just as well. While FIG. 1 shows transistors $M_5$ and $M_6$ as NMOS transistors, PMOS transistors can also be used and the position of the transistors can be altered within the topology for proper functionality of the transmitter.

FIG. 1 also shows source transistors $M_1$ and $M_2$. These transistors can be configured to provide a constant current source or linear resistance to the transmitter 100. The transistors are controlled by their gates which receives analog (pbias) or digital (logic high or low) voltages. The analog voltage, pbias, in one embodiment is generated by a voltage reference circuit such as a band-gap circuit, a current mirror, etc. The value of pbias is adjusted to control the current drive and thus the output swing and power consumption of the transmitter. While $M_1$ and $M_2$ are shown as singular transistors, they can vary in number and size (W/L) based on requirements such as, current source strength, process variation etc. In one embodiment, $M_1$ and $M_2$ are thermometer weighted while in another embodiment they are binary weighted. Other schemes can also be used to achieve scalable current source topology. While FIG. 1 illustrates a current source using PMOS transistors, NMOS transistors can also be used by inversing the topology of the transmitter 100.

P1 and P2, shown in FIG. 1, are output probe connections that transmit the data received by the input transistors $M_3$ and $M_4$. These connections, in one embodiment, hook to package bumps that are connected with package pins and propagating media such as transmission lines.

The switch 101 (SSW) in FIG. 1 connects or disconnects the source transistors $M_1$ and $M_2$ to and from one another. The switch 101, in one embodiment is a pass gate. In another embodiment the switch 101 comprises an NMOS transistor. In another embodiment, the switch 101 comprises a PMOS transistor.

The operation of SSW 101 in relation to the transmitter topology is explained in the following three configurable embodiments of the reconfigurable transmitter:

(a) Differential Current Mode:

In this mode, the reconfigurable transmitter is configured to transmit differential current based signals via the output probes P1 and P2. In this configuration, the source transistors $M_1$ and $M_2$ receive analog pbias voltages instead of digital signals. The value of pbias is configured to set a constant current through transistors $M_1$ and $M_2$. The switch 101 is closed to establish a virtual common node between one of the terminals of the transistors $M_1$ and $M_2$ (the other terminal is connected to supply VCC in FIG. 1). The inputs to the transistors $M_3$ and $M_4$ are set at complementary values. For example, when input $d_1$ at $M_3$ gate is high, $d_{1b}$ at $M_4$ gate is low. The impedance transistors $M_5$ and $M_6$ are configured to achieve a particular impedance value based on power, performance (as discussed above), and PVT (process, voltage, and temperature) compensation requirements.

(b) Differential Voltage Mode:

In this mode, the reconfigurable transistor is configured to transmit differential voltage based signals via the output probes P1 and P2. In this configuration, transistors $M_1$ and $M_2$ receive digital signals at their gates instead of analog pbias reference voltages. In one embodiment, transistors $M_1$ an $M_2$ are PMOS transistors and so receive a logical low at their gates to turn the transistors on. In another embodiment, where the reconfigurable transmitter is an NMOS based topology, $M_1$ and $M_2$ receive a logical high at their gates to turn the transistors on. Transistors $M_1$ and $M_2$ are configured to be in linear region to provide a low resistance path to the supply rail—where the supply rail is VCC for PMOS transistors and GND for NMOS based topology. The switch 101 is closed to establish a virtual supply node. The inputs to the gates of transistors $M_3$ and $M_4$ are set to be complementary. The number and size of the transistors $M_3$ and $M_4$ is adjusted to achieve a predetermined output voltage swing (based on performance requirements) at the output probes P1 and P2. In one embodiment, the predetermined output swing ranges from 100 mV to 1V. Transistors $M_5$ and $M_6$ are selectively driven by data bits at their gates instead of their gates being pulled high as in the differential current mode. The total size (W/L) of the selected devices determines the termination impedance of the reconfigurable transmitter.

(c) Single-ended Voltage Mode:

In this mode, the reconfigurable transmitter is configured to transmit single-ended voltage signals via the output probes P1 and P2. Transistors $M_1$ and $M_2$ are controlled by a digital input. In one embodiment, when $M_1$ and $M_2$ are PMOS based transistors, the input to these transistors is a logical low. The switch 101 is opened to decouple the two single-ended branches. In reference to FIG. 1, the left branch (segment) includes transistors $M_1$, $M_3$, and $M_5$, while the right single-ended branch (segment) includes transistors $M_2$, $M_4$, and $M_6$. By opening the switch 101, signal feed-through is avoided due to non-zero resistance of transistors $M_1$ and $M_2$. Signal feed-through may cause performance degradation in the form of undesirable noise at probes P1 and P2. The inputs to the gates of transistors $M_3$ and $M_4$ are now independent of each other. In reference to FIG. 1, in single-ended voltage mode, transistor $M_3$ is driven by input $d_1$ while transistor $M_4$ is driven by another input $d_2$. The impedance transistors, $M_5$ and $M_6$, are selected according to impedance and output swing requirements.

Figure 2:
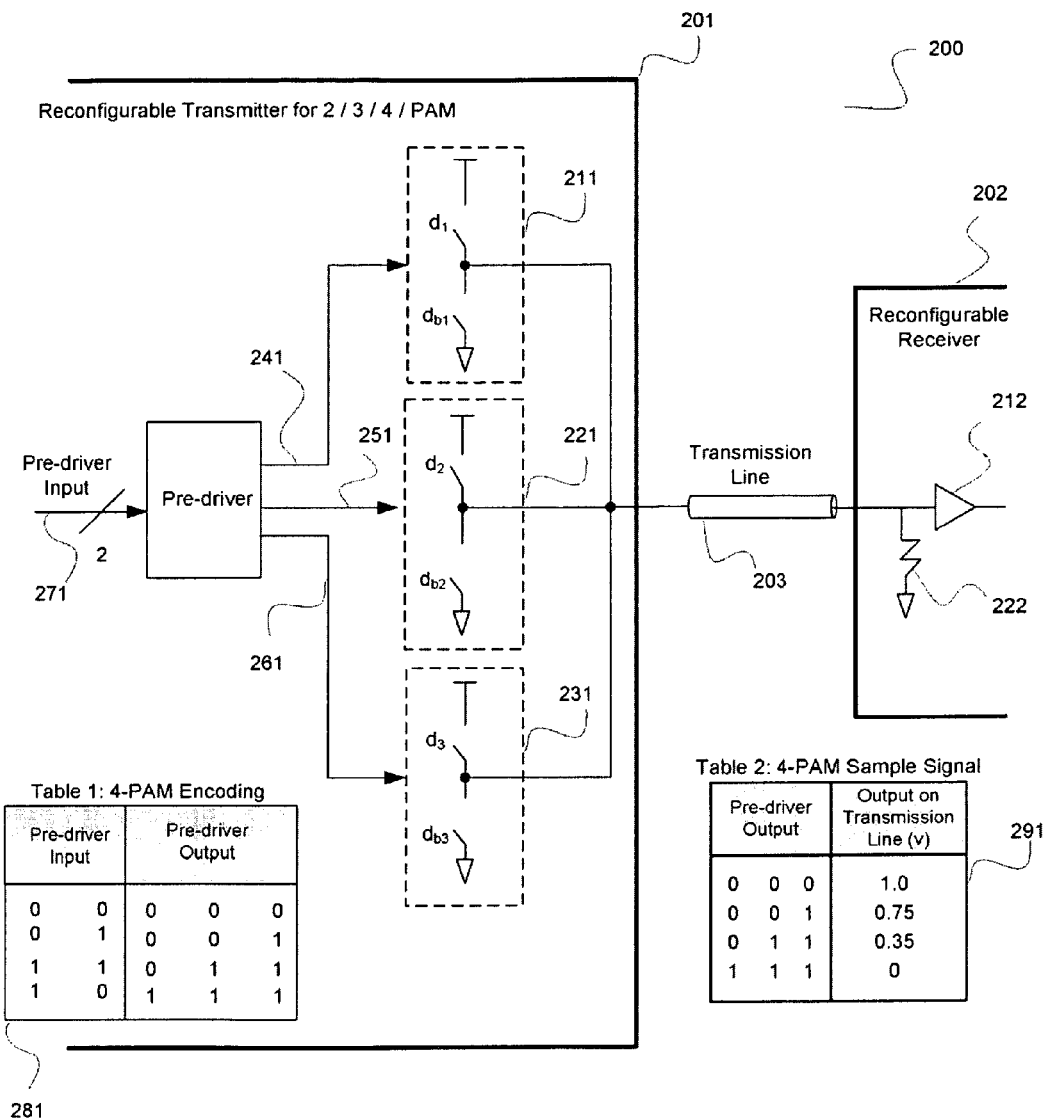
FIG. 2 is a system level topology illustrating a reconfigurable transmitter that can transmit 2-pulse amplitude modulation (PAM,) and 4-PAM signals according to one embodiment of the present invention.

FIG. 2 shows a system topology 200 of a single-ended voltage mode transceiver according to one embodiment of the present invention. The figure is illustrative of a multi-mode signaling scheme provided by the reconfigurable transmitter 201 connected to a reconfigurable receiver 202 via transmission line 203. The multi-mode signaling includes 2-PAM, 3-PAM, 4-PAM, etc., signaling, either in single-ended or differential modes.

In one embodiment, the 2-PAM signaling mode is achieved by transmitter (driver) 211, while other drivers 221 and 231 are connected to independent transmission lines (not shown in FIG. 2). In one embodiment, some drivers are disabled (i.e. not driving any signal) to enable one signaling mode over another. Referring back to the 2-PAM signaling mode, the switch 101 of the reconfigurable transmitter 100 is opened in single-ended voltage mode. Each driver 211, 221, and 231 transmits a 2-level signal, a high and a low, across their respective transmission lines to their respective reconfigurable receivers. FIG. 2 only shows one reconfigurable receiver 202 for illustration purposes. In one embodiment, the receiver has termination impedances such as 222 to improve signal integrity of the received signal.

In one embodiment, 4-PAM signaling mode is achieved by drivers 211, 221, and 231 driving the transmission line 203 together. Table 1, represented by 281 in FIG. 2, is one possible logical truth-table to achieve 4-PAM signaling according to one embodiment on the present invention. The truth-table is implemented within the Pre-driver block that receives a two bit input, 271, and outputs a three bit signal represented by 241, 251, and 261. These output bits control the switching characteristics of each driver, 211, 221, and 231. For example, when the two bit Pre-driver input is set to 00, the Pre-driver output is 000 which means switches $d_1$, $d_2$, and $d_3$ are closed resulting in a strong logical high value driven on the transmission line 203. Switches $d_{b1}$, $d_{b2}$, and $d_{b3}$ behave complementary to switches $d_1$, $d_2$, and $d_3$, and so are open when switches $d_1$, $d_2$, and $d_3$ are closed. The above switches represent transistors $M_{1-6}$ in FIG. 1.

Similarly, when the two bit Pre-driver input is set to 11, the Pre-driver output is 011 i.e. 241 is logical 0, 251 is logical 1, and 261 is logical 1. These Pre-driver outputs cause switch $d_1$ of driver 211 to close and drive a logical high on the transmission line. Switches $d_2$ and $d_3$ of drivers 221 and 231 respectively, remain open and drive a logical 0 on the transmission line 203 because $d_{2b}$ and $d_{3b}$ switches are closed. The blending of logical 1 from driver 211 and logical 0 from drivers 221 and 231 will generate a signal that has a value which is less than midway of logical 1 and logical 0. Table 2, shown as 291 in FIG. 2, illustrates a sample 4-level output driven on the transmission line based on the Pre-driver outputs; 241, 251, and 261.

Therefore, the reconfigurable transmitter can be reconfigured to increase bandwidth by 100% (or two-folds) dynamically, in one embodiment, by configuring the transmitter and receiver dynamically to transmit and receive 4-PAM signals over 2-PAM signals. In one embodiment, the I/O clock frequency remains constant while the reconfigurable transmitter tunes the bandwidth of the signal for transmission from 2-PAM signaling to 4-PAM signaling—a 100% increase in bandwidth of the signal for transmission. In other words, in one embodiment, the I/O clock does not have to increase its frequency to increase bandwidth of the signal for transmission, but dynamically tune from one type of multi-mode signaling to another type of multi-mode signaling.

Figure 2A:
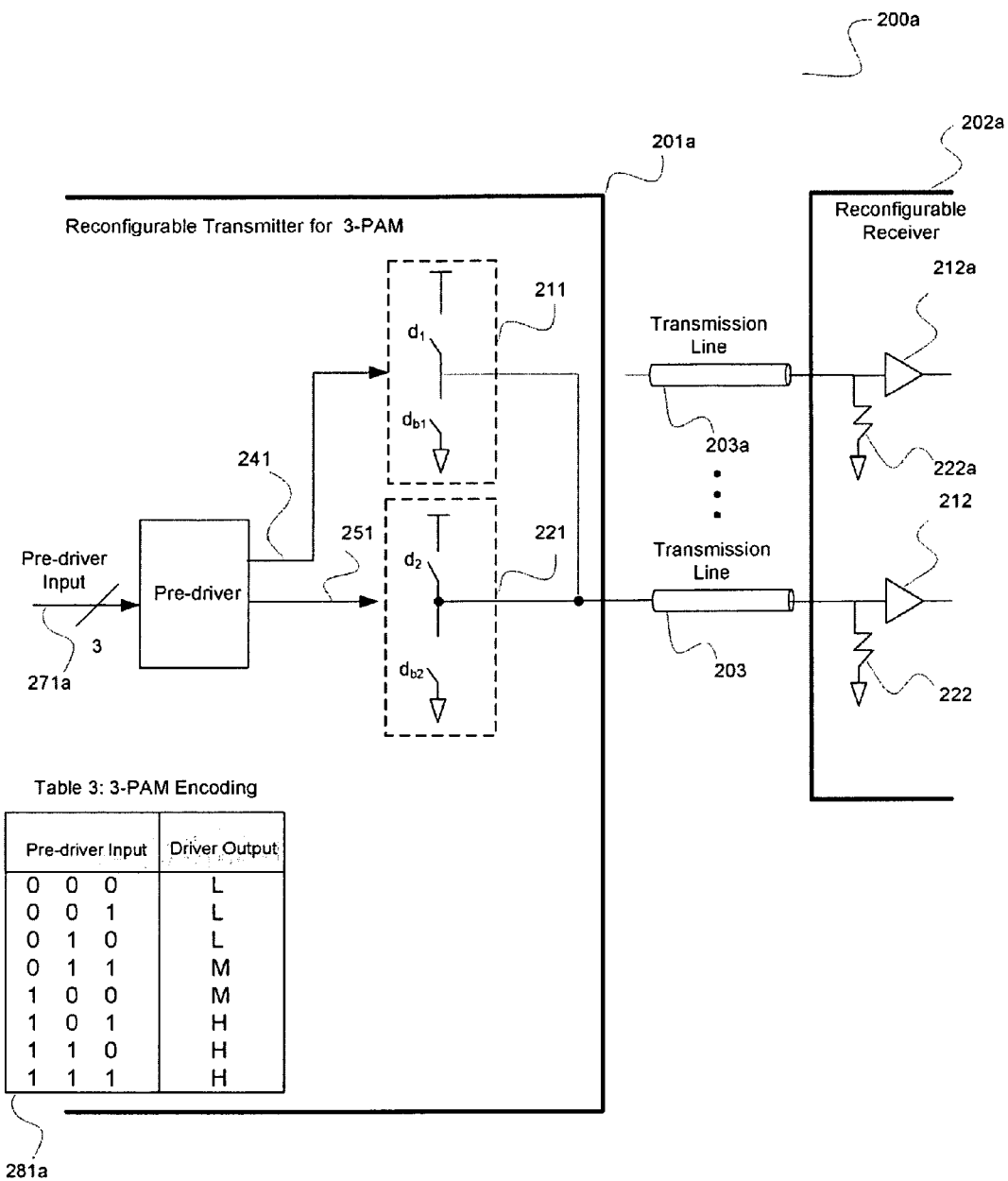
FIG. 2A is a system level topology illustrating a reconfigurable transmitter that can transmit 3-PAM signals according to one embodiment of the present invention.

In one embodiment, 3-PAM signaling mode (also called ternary signaling mode) is achieved by enabling two of the three drivers 211, 221, and 231 driving the transmission line 203 together as shown in FIG. 2A. The 3-PAM signaling mode allows encoding of more than one bit in each transmitted signal—3 bits are encoded in each transmitted signal. This provides a 75% increase in bandwidth over a 2-PAM signaling mode while keeping the I/O clock frequency constant. In one embodiment of 3-PAM signaling mode, transmission line 203 is paired with another transmission line (not shown in FIG. 2) to enable transmitting and receiving of 3-bits along two transmission lines.

FIG. 2A shows a truth table, Table 3 281a, for 3-PAM signaling mode according to one embodiment of the present invention. Other forms of encoding may be done to achieve 3-PAM signaling mode. The Pre-driver receives a three bit input 271a that is encoded according to Table 3. The output level designations 'L' (low), 'M' (medium), and 'H' (high) in Table 3 refer to three output levels from the reconfigurable transmitter 201 in 3-PAM signaling mode. Referring back to FIG. 2, in one embodiment drivers 211 and 221 are enabled while driver 231 is disabled and thus not shown in FIG. 2A. In such a topology of the reconfigurable transmitter 201, the output level of the transmitted signal is 'H' is achieved when switches d1 and d2 are on i.e. both drivers 211 and 221 are driving a logic high value. Similarly, output level of the transmitted signal is 'M' when switch d1 is off while switch d2 is on i.e. driver 211 is driving logic low while driver 221 is driving logic high. Likewise, output level of the transmitted signal is 'L' when both drivers 211 and 221 are driving logic low.

The performance of transmitters is sometimes measured in terms of power per transfer rate. Traditional differential current mode transmitters (drivers) perform at 15-20 mW/Gigabits-per-second (Gbps). The reconfigurable transmitter, in one embodiment, performs at 1-2 mW//Gbps, and so consumes an order of magnitude less power for the same transfer rate. Further reduction in power consumption is achieved by interconnect (transmission line) optimization.

Figure 3:
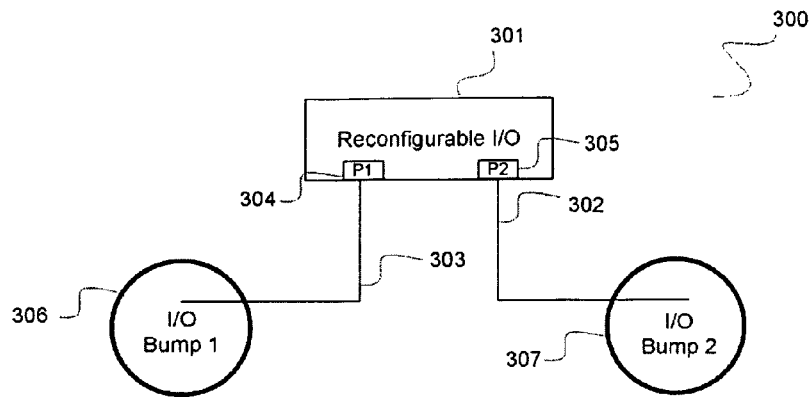
FIG. 3 is a package level view illustrating the relative placement of the reconfigurable transceiver (transmitter and receiver) in reference to the I/O bumps, according to one embodiment of the present invention.

FIG. 3 illustrates the relative placement of the reconfigurable I/O 301 between I/O package bumps, 306 and 307, according to one embodiment of the present invention. Pads P1 and P2, represented by 304 and 305 respectively, drive and receive multi-mode signals to and from the I/O bumps via transmission lines 303 and 302 respectively. By placing the reconfigurable I/O 301 between the I/O bumps 306 and 307, the transmission lines 303 and 302, in one embodiment, have relatively equal route lengths and transmission characteristics. In one embodiment, the distance between the I/O bumps 306 and 307 is 100 μm, where 303 and 302 interconnects (or transmission lines) are relatively shorter in length. Equal and shorter routes for 303 and 302 allow for symmetrical differential signals when the reconfigurable I/O 301 is configured to drive and receive in differential voltage and current modes.

Figure 4:
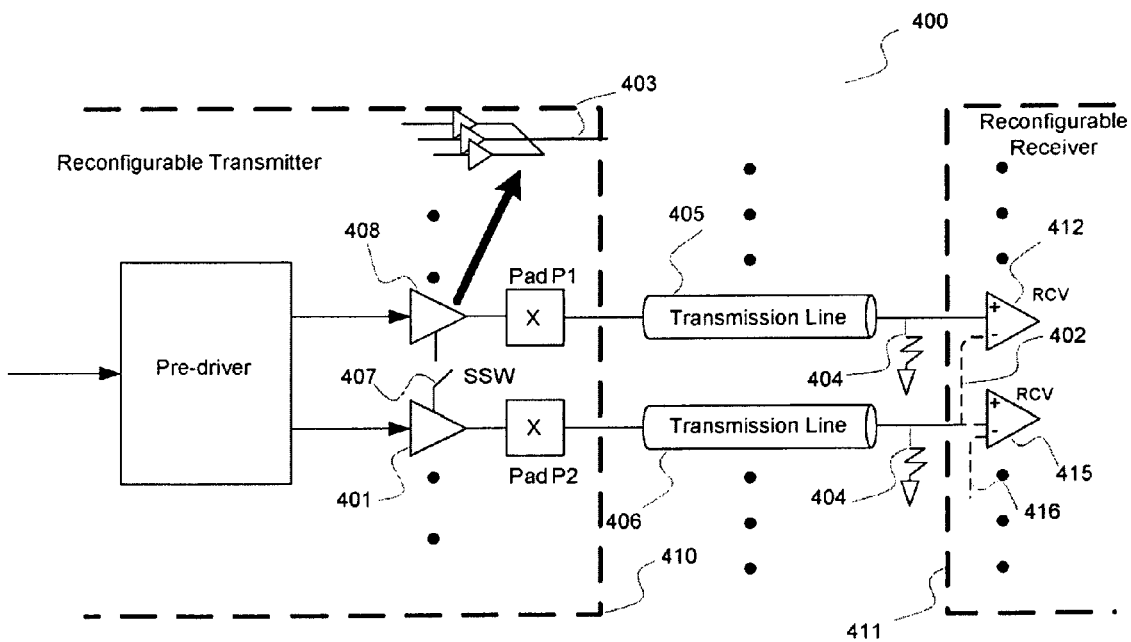
FIG. 4 is a system level topology showing how the reconfigurable transmitter and receiver can be configured for single-ended and differential signaling, according to one embodiment of the present invention.

FIG. 4 illustrates a system level topology 400 of a reconfigurable I/O according to one embodiment of the present invention. Section of the reconfigurable transmitter 100 in FIG. 1 is reproduced in FIG. 4 in functional blocks 401, 407, 408, and the pads P1 and P2. As discussed in the above section about the various modes of the reconfigurable transmitter, the switch 407 (shown as switch 101 in FIG. 1) is opened or closed based on the transmission mode of the reconfigurable transmitter 410. For example in one embodiment, in single-ended voltage mode, the switch 407 is opened and each half (segment) of the reconfigurable transmitter 100 (from FIG. 1), shown as 408 and 401, drive through their respective pads P1 and P2 to the reconfigurable receiver 411 via transmission lines 405 and 406. Termination impedances 404 on the reconfigurable receiver 411 can be dynamically turned on or off (i.e. infinite impedance) depending on system performance requirements.

In one embodiment, the sense amplifiers 412 and 415 in the reconfigurable receiver 411 are configured to receive single-ended or differential mode signals. In one embodiment, the positive input of the sense amplifier 412, in single ended voltage mode, receives a single transmitted by pad P1. The negative input of the sense amplifier 412 is corrected to a reference voltage (not shown in the FIG. 4). In another embodiment, the roles of the positive and negative inputs of the sense amplifiers (412 and 415) are reversed, but the function of the receiver remains the same.

In another embodiment, the reconfigurable transmitter 410 is configured to drive differential signals via pad P1 and pad P2. In that case, the switch 407 is closed. The reconfigurable receiver 411 is configured, in one embodiment, to receive differential signals at its sense amplifiers 412 and 415. In one embodiment, the positive terminal of the sense amplifier, 412, receives the signal driven from pad P1, while the negative terminal of the same sense amplifier receives the signal driven from pad P2 via 402. The output 402 of tile sense amplifier 412 is based on the difference between the differential signals received at the positive and negative inputs of the sense amplifier 412. The second sense amplifier 415 is available for another differential signal pair transmitted by another reconfigurable transmitter (not shown in FIG. 4).

In one embodiment, the driver 408 comprises multiple drivers that are driven independently by the Pre-driver to generate 4-PAM output. 4-PAM signaling mode has twice as much bandwidth as a 2-PAM signaling mode.

Figure 5:
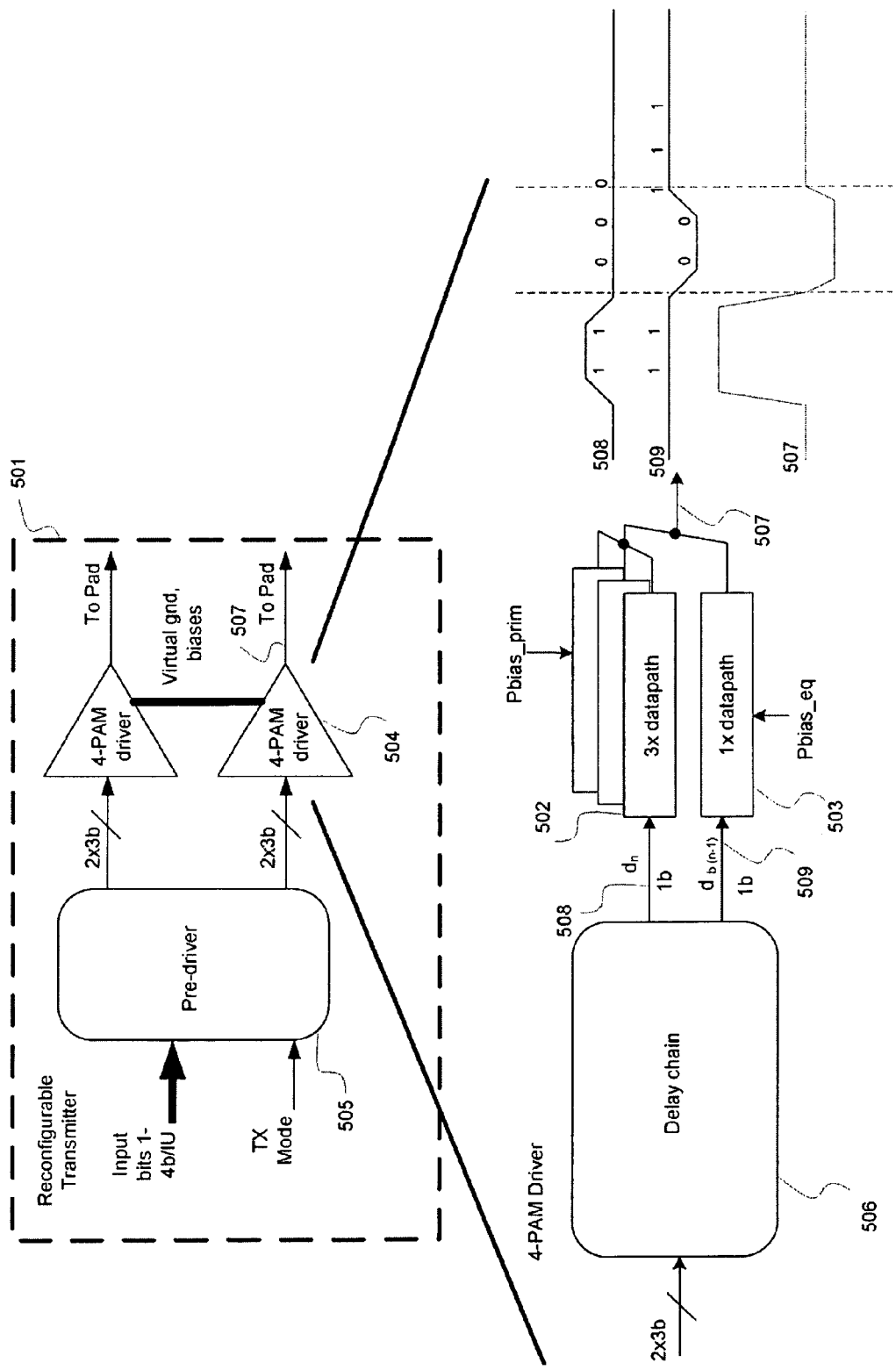
FIG. 5 is a block level topology of the reconfigurable transmitter capable of multi-mode signaling with pre-emphasis, according to one embodiment of the present invention.

FIG. 5 shows a reconfigurable driver pair 501 capable of generating 4 signal levels per output i.e. 4-PAM signaling with pre-emphasis, according to one embodiment of the present invention. The Pre-driver 505 configures the drivers 504 to output 4-PAM based signals.

A functional block level detail, according to one embodiment, of the 4-PAM driver with pre-emphasis capability is also shown in FIG. 5 as block 504. The process of pre-emphasis is applied to the signals for transmission to prevent signal degradation on interconnects due to inter-symbol interference (ISI).

The 3x data path blocks 502 represent three segments or instantiations of the reconfigurable transmitter in FIG. 1. The switch 101 of FIG. 1 is opened. While FIG. 1, discussed previously, illustrates one embodiment of a reconfigurable transmitter that has two halves (segments) when the switch 101 is opened. The 3x data path in FIG. 5 comprises of three such segments. The 1x data path 503 represents one half (segment) of the reconfigurable transmitter 100 of FIG. 1.

The process of pre-emphasis, in one embodiment, is applied in voltage mode, and in another embodiment is applied in current mode. In one embodiment, pre-emphasis on the signal for transmission is applied by transmitting symbols that combine the signal along with its delayed and inverted version. The final resulting signal with pre-emphasis, in one embodiment, is generated by merging the two signal types, 508 and 509, to generate pre-emphasized 507. The delay chain 506 generates inputs for the reconfigurable transmitter segments 502 and 503. The input to the 3x data path driver 502 is data $d_n$, 508, while the input to the 1x data path driver 503 is a delayed and inverted version of the data $d_n$ labeled as $d_{b(n-1)}$ 509. In one embodiment, the driver 503 performs the pre-emphasis on the 4-PAM signal transmitted by 502. In one embodiment, the reconfigurable transmitter provides a 6 dB nominal pre-emphasis. The magnitude of the pre-emphasis in voltage mode, in one embodiment, is controlled by varying the relative transistor sizes of the two sets of segments; 502 and 503.

In one embodiment, the reconfigurable transmitter 501 is configured to transmit current mode signals. In such an embodiment, one way of controlling the magnitude of pre-emphasis on the output signal is by controlling the bias currents to the two sets of segments; 502 and 503. Referring back to FIG. 1, the analog reference, pbias, controls the amount of current that flows through each half of the reconfigurable transmitter. In FIG. 5, pbias for the 3x data-path 502 is referred as pbias_rim while pbias reference for the 1x data-path 503 is referred as pbias_eq. In other embodiments, current bias can be modified to control the magnitude of pre-emphasis when the reconfigurable transmitter is configured to transmit in current mode.

While the present embodiment is described in a 4-PAM signaling configuration, other signaling modes can also be implemented. For example, in one embodiment, a 3-PAM signaling mode with two out of the three output segments is enabled for driver 502.

Referring back to FIG. 1, the reconfigurable transmitter 100 can be configured to control the output swing of the transmitted signal. Output swing is widened to achieve a clearer eye in the eye-diagram. However, a larger output swing results in higher power consumption. In some I/O systems, lower power consumption is desired. In such cases, the reconfigurable I/O can be configured, in one embodiment, in voltage or current mode to generate the minimum required output swing to meet the performance constraints (such as power consumption, bandwidth, signal integrity, voltage swing, and inter-symbol interference) of the system. This is accomplished, in one embodiment, by varying the output device width, say of transistors $M_3$ and $M_4$. Changing these transistor sizes also changes the magnitude of the pre-emphasis. In current mode, the output swing is controlled, in one embodiment, by changing the value of the pbias reference voltage to the source transistors $M_1$ and $M_2$.

The various configurations discussed above allow for dynamic bandwidth and power tuning for dynamic performance optimization of the i/o system. Here, optimization refers to tuning the reconfigurable I/O based on a particular power consumption envelope, output swing, signal to noise ratio, signal integrity, bandwidth (type of multi-mode signaling) etc. The configurations discussed above also allow for tunable bandwidth without changing the clock frequency by switching from 2-PAM to 4-PAM signaling mode, in one embodiment of the present invention.

Figure 6:
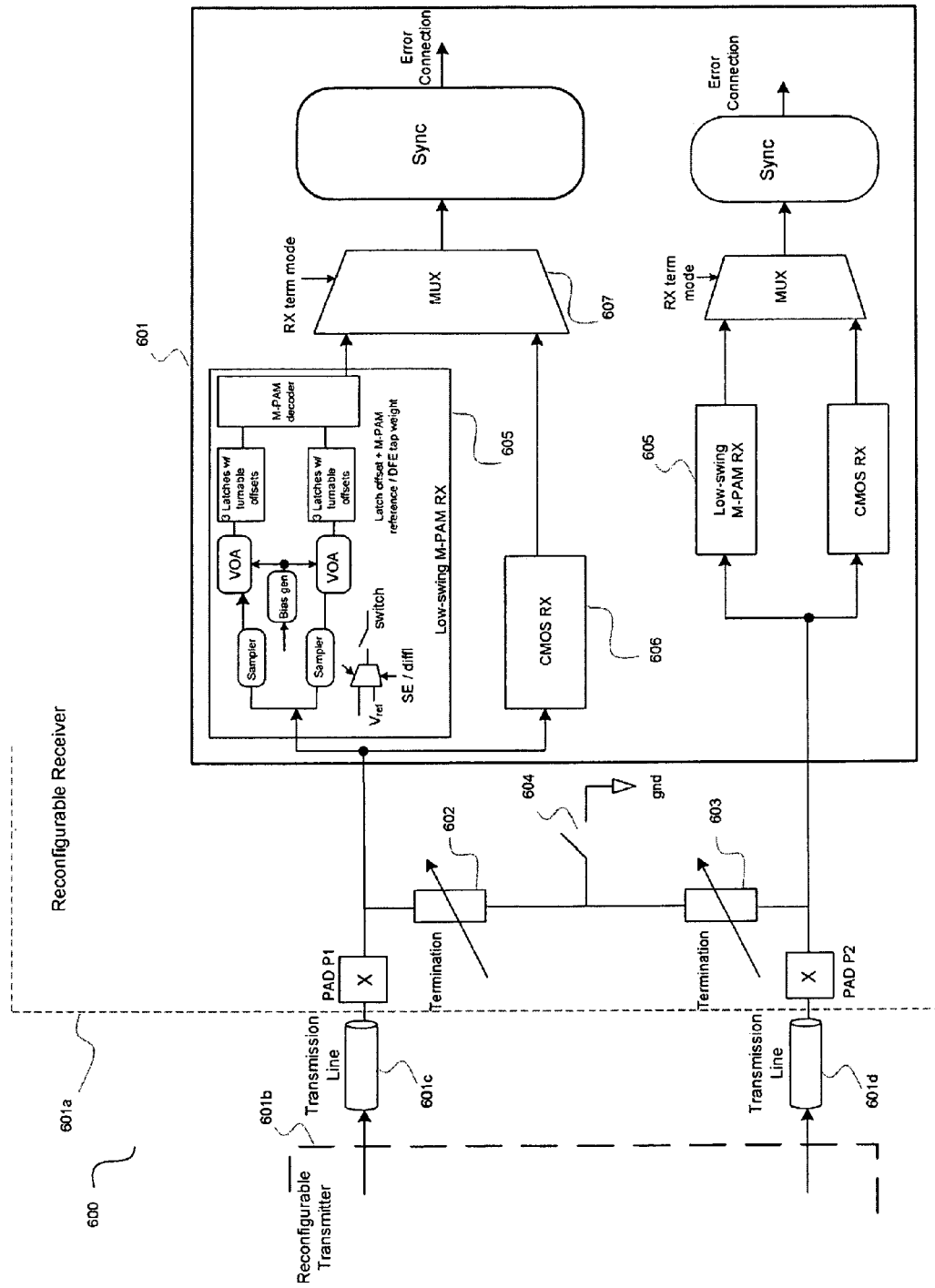
FIG. 6 is a block level topology of a reconfigurable receiver according to one embodiment of the present invention.

FIG. 6 is block level topology for a reconfigurable receiver 601a in a reconfigurable I/O system 600 according to one embodiment of the present invention. Signals are transmitted from the reconfigurable transmitter 601b via the transmission lines, 601c and 601d, to receiver pads P1 and P2. Based on the configuration of the reconfigurable transmitter 601b, various combinations of termination impedance topologies are available. For example, in one embodiment, termination to each transmission line is a shunt termination (603 and 602) connected to ground by closing the switch 604. In another embodiment, the two transmission lines, 601c and 601d, are differentially terminated (i.e. terminated relative to one another) by opening the switch 604. In such a topology, less power is consumed by the system 600 because the path to ground is open instead of being short.

In another embodiment, the receiver is configured to un-terminate its terminations to eliminate current path to ground and thus reduce power consumption and enable low speed transmission of data. In one embodiment, for higher transmission speeds, the receiver is configured to turn on its terminations. In one embodiment, the termination impedance is tunable according to performance requirements.

The logical components of the reconfigurable receiver 601a are shown in 601 according to one embodiment of the present invention. The reconfigurable receiver 601a can support terminated and un-terminated signaling. The multiplexer 607 chooses between the two signaling types based on power consumption and transmission speed requirements. In one embodiment, the input signals at pads P1 and P2 are received by a CMOS receiver 606 and a low-swing receiver 605 that is capable of receiving multi-mode PAM (M-PAM) signals.

A functional block topology of the low-swing receiver 605 is shown according to one embodiment of the present invention. The received signal is first sampled and then sensed by a sense-amplifier with variable offset control (VOA). To decode the M-PAM signal, the output of the sense-amplifiers is fed into an analog to digital converter. Other schemes can be used to decode the M-PAM signals. The CMOS receiver 606 is a traditional receiver in the reconfigurable receiver 601a that is enabled for lower bandwidth and lower speed signals.

The above embodiments of the reconfigurable transmitter and receiver are configured by hardware or software, according to one embodiment of the present invention. In one embodiment, the software to configure the reconfigurable transmitter and receiver can also be stored on a device or machine-readable storage medium and be read by a machine to perform instructions. The machine-readable storage medium includes any mechanism that provides (i.e., stores and/or transmits) information in a form readable by a machine (e.g., a computer). For example, a machine-readable storage medium includes read-only memory (ROM); random-access memory (RAM); magnetic disk storage media; optical storage media; flash memory devices; biological electrical, mechanical systems; electrical, optical, acoustical etc. The device or machine-readable storage medium may include a micro-electromechanical system (MEMS), nanotechnology devices, organic, holographic, solid-state memory device and/or a rotating magnetic or optical disk. The device or machine-readable storage medium may be distributed when partitions of instructions have been separated into different machines, such as across an interconnection of computers.

While the invention has been described in conjunction with specific embodiments thereof, many alternatives, modifications and variations will be apparent to those of ordinary skill in the art in light of the foregoing description. For example, PMOS based reconfigurable transmitter in FIG. 1 can be replaced by an NMOS based topology. Similarly, depending on supply voltage more or less transistors can be added or taken out to or from the stack on each half of the reconfigurable transmitter 100 for more control over pre-emphasis, bandwidth, and signal integrity. Accordingly, the invention is intended to embrace all such alternatives, modifications, and variations as to fall within the broad scope of the appended claims.

We claimed:

1. A reconfigurable transmitter comprising:
    at least two source transistors operable to provide current source and linear resistance;
    a switch, coupled with the at least two source transistors, to provide a virtual common connection between terminals of the at least two source transistors;
    at least two input transistors, coupled with each of the at least two source transistors, to receive signals for transmission;
    at least two controllable terminators, coupled with the at least two input transistors, to provide an impedance termination; and
    output probes coupled with the input transistors and the at least two controllable terminators to output the received signals for transmission as a multi-mode signal, wherein the at least two input transistors are operable to apply tunable pre-emphasis on the received signals for transmission.

2. The reconfigurable transmitter in claim 1, wherein the switch is operable to dynamically tune bandwidth of the output signal at a constant clock frequency.

3. The reconfigurable transmitter in claim 1, wherein the switch is opened in a single ended voltage mode to decouple the source transistors.

4. The reconfigurable transmitter in claim 1, wherein the switch is closed in differential voltage and current modes to provide the virtual common connection.

5. The reconfigurable transmitter in claim 4, wherein the at least two source transistors receive an analog bias voltage at their gates when operating in differential current mode, wherein the virtual common connection is operable to provide a virtual source or a virtual ground node to the terminals of the source transistors.

6. The reconfigurable transmitter in claim 4, wherein the at least two source transistors receive digital voltage at their gates when operating in differential voltage mode, wherein the virtual common connection is operable to provide virtual supply node to the terminals of the at least two source transistors.

7. The reconfigurable transmitter in claim 1, wherein the multi-mode signal includes a 2-pulse amplitude modulation (PAM), 3-PAM, or a 4-PAM signal.

8. The reconfigurable transmitter in claim 1, wherein the source transistors or the controllable terminators or a combination of both are operable together to dynamically adjust power consumption by varying voltage swing of the signals for transmission.

9. A system comprising:
    a reconfigurable transmitter operable as a multi-mode transmitter in a single ended or a differential mode, wherein the reconfigurable transmitter is operable to apply pre-emphasis on signals for transmission, and wherein the reconfigurable transmitter is operable to dynamically adjust power consumption by varying voltage swing of the signals for transmission; and
    a reconfigurable receiver operable as a multi-mode receiver in a single ended or a differential mode corresponding to the mode of operation of the reconfigured transmitter, wherein the reconfigurable transmitter and the reconfigurable receiver are located between package bumps.

10. The system in claim 9, wherein the reconfigurable transmitter is operable to provide dynamically tunable bandwidth at a constant I/O clock frequency.

11. The system in claim 9, wherein the reconfigurable transmitter and the reconfigurable receiver are operable to process multi-mode signals including: 2-pulse amplitude modulation (PAM), 3-PAM, or 4-PAM signals.

12. The system in claim 11, wherein the single ended mode is a voltage mode operable to support the multi-mode signals.

13. The system in claim 9, wherein the differential mode is a current mode or a voltage mode operable to support at least 2-pulse amplitude modulation (PAM) and 4-PAM signals.

14. The system in claim 9, wherein the reconfigurable receiver is operable to control termination impedance in response to power and speed requirements.

15. A system comprising:
    means for transmitting multi-mode signals in single ended and differential modes across transmission lines by reconfiguring transmitters;
    means for receiving the transmitted multi-mode signals in single ended and differential modes across the transmission lines by reconfiguring receivers;
    means for dynamically tuning bandwidth of multi-mode signals for transmission at a constant clock frequency; and
    means for switching between single ended and differential modes in the reconfigured transmitters and receivers.

16. The system in claim 15, further comprising means for voltage swing dependent termination.

17. The system in claim 15, further comprising means for real-time adaptation of the reconfigurable transmitters and receivers to workload demands.

* * * * *